United States Patent [19]

Henkel et al.

[11] Patent Number: 4,983,419

[45] Date of Patent: Jan. 8, 1991

[54] METHOD FOR GENERATING THIN LAYERS ON A SILICONE BASE

[75] Inventors: Hans-Joachim Henkel, Erlangen; Helmut Markert, Nuremberg; Wolfgang Roth, Uttenreuth; Wolfgang Kautek, Berlin, all of Fed. Rep. of Germany

[73] Assignee: Siemens Aktiengesellschaft, Berlin & Munich, Fed. Rep. of Germany

[21] Appl. No.: 384,291

[22] Filed: Jul. 21, 1989

[30] Foreign Application Priority Data

Aug. 5, 1988 [DE] Fed. Rep. of Germany ....... 3826713

[51] Int. Cl.$^5$ .............................................. B05D 3/06
[52] U.S. Cl. ..................................... 427/53.1; 427/58; 427/96; 427/376.2
[58] Field of Search ............... 427/53.1, 58, 96, 376.2; 264/25; 219/121.6, 121.85

[56] References Cited

U.S. PATENT DOCUMENTS 3,847,771 11/1974 McGinniss ..................... 204/159.24
4,526,807 7/1985 Auerbach ........................... 427/53.1

FOREIGN PATENT DOCUMENTS 0202803 11/1986 European Pat. Off. .

OTHER PUBLICATIONS

Patent Abstracts of Japan, Bd. 9, Nr. 4 (E-288) (1727), 10. Jan. 1985; & JP-A-59 154 029 (Nippon Denshin Denwa Kosha), 3/09.84.

Chemical Abstracts, Bd. 98, Nr. 12, 21. Marz 1983, S. 258 Zusammenfassung Nr. 93785w, Columbus, Ohio, US; & JP-A-57 181 326 (Mitsubishi Heavy Industries Ltd.) 8.11.82.

IBM Technical Disclosure Bulletin, Bd. 26, Nr. 10B, Marz 1984, 5683, New York, US; D. C. Hofer et al.: "Silane Polymer Excimer Laser Photoresist adasion", 29. Jhrg., (1985), Nr. 10, S. 28-35.

"Plaste and Kautshuk", 34. Jahrg. (1987), Nr. 5, S. 183-190.

"Polymer Preprints", vol. 20 (1979), No. 2, S. 443-446.

"J. Polym. Sci.-Part-A-1", vol. 4 (1966), S. 2107-2120.

"J. Organometal. Chem.", vol. 148 (1978), S. 213-223.

*Primary Examiner*—Stanley Silverman
*Attorney, Agent, or Firm*—Kenyon & Kenyon

[57] ABSTRACT

The invention provides a method for generating thin layers on a silicon base having a high purity, thermal stability and good dielectric properties wherein non-functionalized organosiloxanes with alkyl groups or alkyl and aryl groups are photochemically polymerized and/or cross-linked by means of pulsed laser radiation with a wavelength of less than 400 nm where the pulse duration is 10 ps to 1 ms, the pulse frequency is 1 Hz to 10 KHz and the energy density is at least 1 $J/cm^2$ and the irradiation takes placed with one or more pulses. The layers can be used as passivating and insulating layers for semiconductor components and circuits.

18 Claims, No Drawings

METHOD FOR GENERATING THIN LAYERS ON A SILICONE BASE

FIELD OF THE INVENTION

The invention relates to a method for generating thin layers on a silicone base photo hardening of organosiloxanes as well as to the use of such thin layers.

BACKGROUND OF THE INVENTION

Among other uses, thin layers on a silicone base serve as surface coatings for the most varied materials. For example, paper and high-polymer substances can be coated and metals can be varnished with silicones. Silicone layers can also serve as primary coatings of lightwave guides (see in this connection, for instance: "Adhaesion", Vol. 29, (1985), No. 10, pages 28 to 35, as well as "Plaste and Kautschuk", Vol. 34, (1987) No. 5, Pages 183 to 190).

Unsaturated organosiloxanes are commonly polymerized and cross-linked thermally with the addition of suitable initiators such as peroxides or catalysts such as platinum compounds. The photochemical polymerization and cross-linking of unsaturated organosiloxanes through, for example, irradiation with light, especially UV light, is also known. Without the addition of photo initiators and/or photo sensitizers, however, long irradiation times are required for this purpose. Direct photo cross-linking of organosiloxanes without the addition of photo initiators or photo sensitizers requires the presence of chromophores in the molecule which enter into interaction with the light. Such structural elements are, for instance, maleinimide groups.

Non-functionalized organosiloxanes such as poly(dimethyl siloxane) and poly(methylphenyl siloxane) are discolored by irradiation with UV light; gel formation i.e., cross-linking takes place only in the presence of air (see: "Polymer Preprints", Vol. 20 (1979) No. 2, Pages 443 to 446). Upon irradiation with a low-pressure mercury lamp, poly(methylphenyl siloxane) only forms a superficial film, and only partial cross-linking takes place. After an irradiation of more than 100 hours, a change of the mean molecular weight of less than 2% is found (see: "J. Polym. Sci.-Part A-1", Vol. 4, (1966) pages 2107 to 2120).

However, the above-mentioned methods suffer the disadvantage of not producing high-purity and thermally stable thin films. In particular, impurities due to the required addition of photo initiators and photo sensitizers have a technically adverse effect. A further disadvantage is that upon UV cross-linking, discoloration, insufficient transparency and insufficient thermal stability result for thin layers made from silicone acrylates. A further disadvantage of the known methods is that they are not economical because long irradiation times are required (see in this connection, for instance,: "J. Organometal. Chem.", Vol. 148 (1978), Pages 213 to 223).

Accordingly, it is an object of the invention to provide a method for generating thin layers with a silicone base having high purity, thermal stability and good dielectric properties by photo hardening which requires only short irradiation times.

SUMMARY OF THE INVENTION

According to the invention, non-functionalized organosiloxanes with alkyl groups or alkyl and aryl groups are polymerized and/or cross-linked photochemically by means of pulse laser radiation with a wavelength of less than 400 nm, where the pulse duration is 10 ps to 1 ms, the pulse frequency is 1 Hz to 10 kHz and the energy density is at least 1 J/cm$^2$ and where the irradiation takes place with one or several pulses.

DETAILED DESCRIPTION OF THE INVENTION

In the method according to the invention, it is essential that no photo initiators or photo sensitizers be used. It is also essential that organosiloxanes which have no functional groups ("non-functionalized" organosiloxanes) be used. These compounds contain only alkyl groups or alkyl and aryl groups. The mol ratio of aryl groups to alkyl groups of the organosiloxanes used, or mixtures made therefrom, is advantageously 2.0 at a maximum; the mol ratio is preferably 0.001 to 0.5. The alkyl groups may be of a linear (i.e., not branched), branched or cyclic nature. The aryl groups may be alkyl-substituted, so that, for instance, a tolyl radical is present. Condensed systems such as naphthyl may also be present.

The organosiloxanes may be built up linearly, branched or cyclic. It is essential that the organosiloxanes have a high degree of purity. For example, in the application of the layers produced according to the invention in microelectronics, elements influencing the semiconductor operation such as sodium as well as α-radiators such as uranium and thorium and elements causing corrosion such as halogens must largely be avoided.

The organosiloxanes used in the method of the invention generally have the following structure:

(a) Linear compounds:

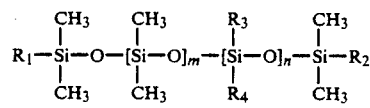

Where $R_1$, $R_2$, $R_3$ and $R_4$ are alkyl or aryl groups, and where in the presence of aryl groups the above-mentioned ratio of aryl to alkyl groups applies, and further where m, n $\geq$ 0.

(b) Branched compounds:

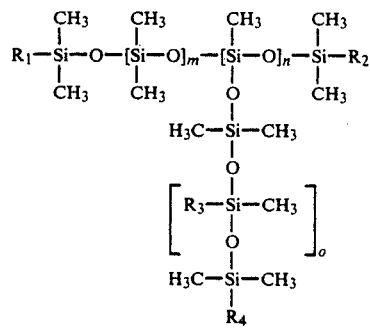

Where $R_1$, $R_2$, $R_3$ and $R_4$ are alkyl or aryl groups, and where in the presence of aryl groups the above-mentioned ratio of aryl to alkyl groups applies, and further where m, o $\geq$ 0 and n $\geq$ 1.

(c) Cyclic compounds:

Where $n_1 = 3$ or $4$ and $n_2 = 3$.

The organosiloxanes are subjected to irradiation with a wavelength of less than 400 nm. Preferably, the wavelength is in the range from 190 to 300 nm. Advantageously, a poly(dimethyl siloxane) is used in the method according to the invention, using a wavelength of 193 nm for irradiation, or, a poly(methylphenyl siloxane), using a wavelength from 240 to 280 nm for irradiation. Preferably, the irradiation itself takes place in an oxygen-free atmosphere. For enhancing the cross-linking and/or improving the boundary surface adhesion, small amounts of siloxanes containing vinyl groups such as poly(methylvinylsiloxane) can be added to the organosiloxanes. Preferably, the amount of such siloxanes is from 0.5 to 1.0 mass percent.

According to the method of the invention, layers with a thickness of up to 100 μm are produced. These layers exhibit high purity and are thermally stable at temperature to more than 180° C. Furthermore, the layers exhibit long-term stability which is an all important feature. The thin layers prepared in accordance with the method of the invention can advantageously serve as passivating and insulating layers for semiconductor components and electronic circuits. In addition, these layers can be used as structure passivating and insulating layers or as etching masks in the production of semiconductor components. For this purpose, in the preparation of the thin layers the irradiation takes place through a mask, i.e., a mask is arranged between the pulsed laser and the organosiloxane to be irradiated, so that an image-like irradiation is applied.

The invention will be explained in greater detail, in the following embodiment examples.

EXAMPLE 1

Irradiation of a Poly(methylphenyl siloxane)

A poly(methylphenyl siloxane) with the following structure

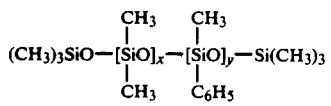

with a methyl/phenyl ratio of 20:1 and a viscosity of 2000 mPa. s (at 25° C.) is applied to a silicon wafer by means of spin coating. The irradiation takes place in a reaction chamber through which a stream of nitrogen had been conducted for 15 minutes. A dye laser pumped with an Nd/YAG laser serves as the irradiator. The following irradiation parameters are observed: unfocused laser beam, wavelength $\lambda = 266$ nm, frequency $\nu = 10$ Hz, pulse duration $t = 10$ ns, number of pulses $n = 1000$, energy density $E \approx 30$ J/cm². The irradiation is followed by a treatment with dichloro methane as a developer, where the exposed spot remains on the silicon wafer. The layer thickness is about 20 μm.

EXAMPLE 2

Irradiation of a Poly(dimethyl siloxane)

A poly(dimethyl siloxane) with the following structure

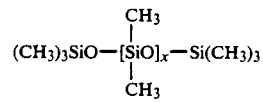

with a viscosity of 1000 mPa. s (at 25° C.) is applied to a silicon wafer by means of spin coating. The irradiation takes place in a reaction chamber which had been evacuated for 30 minutes at a pressure of $2 \times 10^{-5}$ mbar. An ArF laser serves as the irradiator, the following irradiation parameters being observed: unfocused laser beam, $\lambda = 193$ nm, $\nu = 50$ Hz, $t = 30$ ns, $n = 1000$, $E \approx 74$ J/cm².

After the irradiation, a treatment with dichloromethane as a developer follows, the exposed spot remaining on the silicon wafer. The layer thickness is about 2.5 μm.

EXAMPLE 3

Irradiation of a Poly(methylphenyl siloxane) with an addition of a vinyl group- containing siloxane A poly(methylphenyl siloxane) according to Example 1 to which 0.5 mass percent of a methylvinyl siloxane/dimethyl siloxane copolymer with a vinyl content of 7.5 percent had been added is applied to a silicon wafer in accordance with Example 1 and is irradiated, the following irradiation parameters being observed: unfocused laser beam, $\lambda = 266$ nm, $\nu = 10$ Hz, $t = 10$ ns, $n = 300$, $E \approx 10$ J/cm².

The irradiation is followed by a treatment with dichloromethane as a developer, the exposed spot remaining on the silicon wafer. The layer thickness is about 20 μm.

What is claimed is:

1. A method for generating a thin layer on a silicone base comprising the step of photo hardening a non-functionalized organosiloxane having alkyl groups or alyl and aryl groups, or mixtures of such organosiloxanes, so as to photochemically polymerize and/or cross-link the organosiloxane, said step of photo hardening being accomplished by irradiating the organosiloxane with pulsed laser radiation with a wavelength of less than 400 nm, wherein the pulse duration is 10 ps to 1 ms, the pulse frequency is 1 Hz to 10 kHz and the energy density is at least 1 J/cm², and wherein the irradiation takes place with one or more pulses.

2. A method according to claim 1 wherein the mol ratio of all the aryl groups to all the alkyl groups of all the organosiloxanes used is not greater than 2.0.

3. A method according to claim 2 wherein the mol ratio of all the aryl groups to all the alkyl groups of all the organosiloxanes used is from 0.001 to 0.5.

4. A method according to claim 1 wherein the pulsed laser radiation has a wavelength of from 190 to 300 nm.

5. A method according to claim 1 wherein the organosiloxane employed is a poly(dimethyl siloxane) and wherein the pulsed laser radiation has a wavelength of 193 nm.

6. A method according to claim 1 wherein a poly(methylphenyl siloxane) is employed and wherein the irradiation takes place with a wavelength of from 240 to 280 nm.

7. A method according to claim 1 wherein small amounts of vinyl-group-containing siloxanes are added to the organosiloxane prior to photo hardening.

8. A method according to claim 7 wherein the amount of vinyl-group-containing siloxanes added is from 0.5 to 1.0 mass percent.

9. A method according to claim 1 wherein the irradiation is carried out in an oxygen-free atmosphere.

10. A method according to claim 1 wherein the irradiation is carried out through a mask.

11. A passivating and/or insulating layer for discrete semiconductor components and integrated semiconductor circuits formed according to the method of claim 1.

12. A structured passivating and/or insulating layer in a semiconductor circuit formed according to the method of claim 1.

13. A method according to claim 2 wherein the pulsed laser radiation has a wavelength of from 190 nm to 300 nm.

14. A method according to claim 2 wherein the organosiloxane is a poly(dimethyl siloxane) and the pulsed laser radiation has a wavelength of about 193 nm.

15. A method according to claim 2 wherein the organosiloxane is a poly(methylphenyl siloxane) and the pulsed laser radiation has a wavelength of from 240 to 280 n.

16. A method according to claim 2 wherein vinyl-group-containing siloxanes are added to the organosiloxane prior to irradiation in an amount of from b 0.5 to 1.0 mass percent.

17. A method according to claim 2 wherein the irradiation is carried out through a mask.

18. A method according to claim 2 wherein the irradiation is carried out in an oxygen-free atmosphere.

* * * * *